(12) United States Patent
Kassovski et al.

(10) Patent No.: US 11,193,835 B2
(45) Date of Patent: Dec. 7, 2021

(54) ERROR COMPENSATION FOR SHEATHED SENSORS

(71) Applicant: Melexis Technologies NV, Tessenderlo (BE)

(72) Inventors: Viktor Kassovski, Sofia (BG); Kostadin Bobchev, Sofia (BG); Ivan Lesichkov, Sofia (BG)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 343 days.

(21) Appl. No.: 16/190,384

(22) Filed: Nov. 14, 2018

(65) Prior Publication Data

US 2019/0145836 A1 May 16, 2019

(30) Foreign Application Priority Data

Nov. 15, 2017 (EP) ..................................... 17201975

(51) Int. Cl.
*G01K 7/00* (2006.01)
*G01K 7/10* (2006.01)
(Continued)

(52) U.S. Cl.
CPC ................. *G01K 7/10* (2013.01); *G01K 1/08* (2013.01); *G01K 7/021* (2013.01); *G01K 15/005* (2013.01); *G01R 27/08* (2013.01); *G01R 31/2829* (2013.01)

(58) Field of Classification Search
USPC ........................................ 374/179, 183, 1, 3
See application file for complete search history.

(56) References Cited

U.S. PATENT DOCUMENTS 5,228,780 A 7/1993 Shepard et al.
5,700,090 A 12/1997 Eryurek
(Continued)

FOREIGN PATENT DOCUMENTS

EP 3070446 A1 9/2016
GB 2507093 A 4/2014

OTHER PUBLICATIONS

GB2507093 EPO document (Year: 2014).*
European Search Report from EP Application No. 17201975.4, dated May 11, 2018.

*Primary Examiner* — Lisa M Caputo
*Assistant Examiner* — Nasir U. Ahmed
(74) *Attorney, Agent, or Firm* — Workman Nydegger

(57) ABSTRACT

A circuit for determining and/or compensating for a measurement error of a sheathed sensor due to a property of a sheath of that sheathed sensor comprises a first and a second terminal for connecting to a pair of sensor signal leads of a sensor element in a sheathed sensor and a voltage measurement circuit. A switching unit controls switching an electrical connection between a first and a second state. A correction measurement circuit generates a correction signal indicative of that a measured current running from the first terminal through the switching unit. A controller receives the measurement and correction signal in both the first and second state, and calculates an error value indicative of the measurement error and/or a sensor readout value that is corrected for the measurement error by taking the measurement and correction signal into account as obtained in both the first and second state.

19 Claims, 3 Drawing Sheets

(51) Int. Cl.
*G01K 1/08* (2021.01)
*G01K 7/02* (2021.01)
*G01R 31/28* (2006.01)
*G01R 27/08* (2006.01)
*G01K 15/00* (2006.01)

(56) References Cited

U.S. PATENT DOCUMENTS

| | | | |
|---|---|---|---|
| 5,828,567 A * | 10/1998 | Eryurek | G01K 15/00 700/79 |
| 5,876,122 A | 3/1999 | Eryurek | |
| 6,594,603 B1 | 7/2003 | Eryurek et al. | |
| 2007/0183478 A1* | 8/2007 | Becker | G01K 15/00 374/183 |
| 2014/0088905 A1 | 3/2014 | Rud | |
| 2014/0145737 A1 | 5/2014 | Lacombe et al. | |
| 2015/0276498 A1* | 10/2015 | Van Minnen | G01K 7/026 374/181 |

* cited by examiner

ERROR COMPENSATION FOR SHEATHED SENSORS

FIELD OF THE INVENTION

The invention relates to the field of sensors embedded in a protective sheath. More specifically it relates to a circuit and method for determining of and/or compensating for a measurement error of a sheathed sensor due to a property of a sheath of the sheathed sensor.

BACKGROUND OF THE INVENTION

Various sensors known in the art, such as thermocouples and resistive temperature detectors (RTD) elements, are sensitive to their external environment. For protection, such sensors require electrical isolation, for example by embedding the sensor in a sheath and filling the space between the sensor and the sheath with an electrically insulating material. The resistance between the sensor and its sheath is generally referred to as isolation resistance (RISO). However, such isolation resistance can change over time, for example due to various factors such as heating and vibrations.

In applications, the sensor sheath can be at an electric potential that differs from the ground reference voltage GND, e.g. by a difference $\Delta V_{GND}$. Therefore, when the isolation resistance is too low, a leakage through the isolation resistance can occur. This leakage can influence the sensor measurement, e.g. can lead to a measurement error.

The U.S. Pat. No. 5,700,090 discloses an approach to testing and/or calibrating thermometers. However, it is a disadvantage of the disclosed approach that a separate connection is required to the protective sheath of the sensor. Furthermore, while an approach in accordance with D1 may be used to take a resistance between a sensor terminal and the protective sheath into account, it does not compensate for a resistance between the protective sheath and the effective ground GND, e.g. for the difference $\Delta V_{GND}$.

SUMMARY OF THE INVENTION

It is an object of embodiments of the present invention to provide good and efficient means and methods for determining and/or compensating for, e.g. correcting for, a measurement error due to leakage through an insulation resistance (RISO) of a sheathed sensor and/or due to a parasitic lead-to-ground voltage, e.g. due to effects associated with a remote ground.

The above objective is accomplished by a method and device according to the present invention.

It is an advantage of embodiments of the present invention that different types of errors caused by changes in material properties of a sheathed sensor can be calculated and/or compensated for, without directly measuring the insulation resistance (RISO).

It is an advantage of embodiments of the present invention that not only the insulation resistance can be determined and/or compensated for, but also other error sources such as a resistance between the sheath and the actual electric ground potential of the circuit.

In a first aspect, the present invention relates to a circuit for determining and/or compensating for a measurement error of a sheathed sensor due to a property of a sheath of the sheathed sensor. The circuit comprises a first terminal and a second terminal for connecting to a pair of sensor signal leads of a sensor element in a sheathed sensor. The circuit comprises a voltage measurement circuit for measuring a voltage difference between the first terminal and the second terminal and for generating a measurement signal indicative of the measured voltage difference. The circuit comprises a switching unit for controllably switching an electrical connection between a first state and a second state in which the first terminal is electrically connected to respectively a first reference voltage and a second reference voltage. The circuit comprises a correction measurement circuit for measuring a current running from the first terminal through the switching unit and for generating a correction signal indicative of the current. The circuit comprises a controller for receiving both the measurement signal and the correction signal in both the first state and the second state by controlling the switching of the switching unit. The controller is adapted for calculating an error value indicative of the measurement error and/or a sensor readout value that is corrected for the measurement error, by taking the measurement signal and the correction signal into account as generated in both the first state and the second state.

In a circuit in accordance with embodiments of the present invention, the switching unit may comprise an internal voltage source for generating the second reference voltage, and the first reference voltage may be an electric ground potential.

In a circuit in accordance with embodiments of the present invention, the switching unit may comprise a first internal voltage source for generating the first reference voltage and a second internal voltage source for generating the second reference voltage.

In a circuit in accordance with embodiments of the present invention, the controller may be adapted for calculating a loop resistance between an electric ground of the circuit and a remote ground of the sheathed sensor by dividing a difference of the second reference voltage and the first reference voltage by a difference of the correction signal obtained in the first state of the switching unit and the correction signal obtained in the second state of the switching unit. For example, the difference of the second reference voltage and the first reference voltage may be the second reference voltage in embodiments where the first reference voltage is the electric ground potential.

In a circuit in accordance with embodiments of the present invention, the controller may be adapted for calculating the error value indicative of the measurement error and/or the sensor readout value corrected for the measurement error. The measurement error may represent a deviation between the voltage difference and an electromotive force and/or the sensor readout value may be indicative of the electromotive force. The electromotive force may be an electromotive force generated over a thermocouple when the circuit is connected to the sheathed sensor in which the sensor element comprises the thermocouple.

In a circuit in accordance with embodiments of the present invention, the controller may be adapted for calculating a first difference of the measurement signal obtained in the first state of the switching unit and the measurement signal obtained in the second state of the switching unit and a second difference of the correction signal obtained in the first state of the switching unit and the correction signal obtained in the second state of the switching unit. Calculating the error value and/or the sensor readout value may comprise multiplying the correction signal obtained in the first state of the switching unit by a ratio of the first difference and the second difference.

In a circuit in accordance with embodiments of the present invention, the controller may be adapted for calculating the error value indicative of the measurement error and/or the sensor readout value corrected for the measurement error, in which the sensor readout value is indicative of a resistance of a resistive temperature detector and/or the error value represents an error of the resistance due to a leakage current and/or a parasitic resistance, e.g. when the circuit is operably connected to the sheathed sensor in which the sensor element comprises the resistive temperature detector.

In a circuit in accordance with embodiments of the present invention, the measurement error may represent an insulation resistance of a sheath of the sheathed sensor, a loop resistance between an electric ground of the circuit and a remote ground of the sheath and/or a leakage current through the sheath.

A circuit in accordance with embodiments of the present invention may comprise a current source for injecting a further electric current via the first terminal or the second terminal into the sensor element when the circuit is connected to the sheathed sensor.

In a circuit in accordance with embodiments of the present invention, the controller may be adapted for calculating the error value and/or the sensor readout value, in which said calculation comprises calculating a subtraction of a minuend comprising $$\frac{Vd_1 \cdot I_0}{Isens \cdot I_1}$$

and a subtrahend comprising $$\frac{Vd_1}{I_1},$$

in which $Vd_0$ and $Vd_1$ represent the measurement signal in respectively the first state and the second state, $I_0$ and $I_1$ represent the correction signal in respectively the first state and the second state and Isens represent the further electric current.

In a circuit in accordance with embodiments of the present invention, the correction measurement circuit may comprise a reference resistor having a predetermined resistance and a further voltage measurement circuit for measuring a voltage over the resistor, such that the correction measurement circuit is adapted for generating the correction signal as indicative of the current in the form of the voltage over the reference resistor.

In a circuit in accordance with embodiments of the present invention, the switching unit may comprise a first switch for controllably electrically connecting and disconnecting the first terminal to the first reference voltage and a second switch for controllably electrically connecting and disconnecting the first terminal to the second reference voltage.

In a second aspect, the present invention relates to a sensor system comprising a circuit in accordance with embodiments of the first aspect of the present invention and a sheathed sensor comprising a sensor element having complementary terminals connected to respectively a first lead and a second lead of a pair of sensor signal leads, in which the sensor element is positioned within a sheath for electrically insulating the sensor element and the pair of sensor signal leads to reduce and/or prevent external electromagnetic disturbances of the sheathed sensor. The pair of sensor signal leads extend from the sheath to connect to the first and second terminal of the circuit.

In a sensor system in accordance with embodiments of the present invention, the sensor element may comprise a thermocouple.

In a sensor system in accordance with embodiments of the present invention, the sensor element may comprise a resistive temperature detector.

In a third aspect, the present invention relates to a method for determining and/or compensating for a measurement error of a sheathed sensor due to a property of a sheath of the sheathed sensor. The method comprises providing a sheathed sensor comprising a sensor element positioned within a sheath for electrically insulating the sensor element to reduce and/or prevent external electromagnetic disturbances of the sheathed sensor. The method comprises connecting a first terminal of the sensor element to a first reference voltage, measuring a first voltage difference over the sensor element and measuring a first current flowing through the sensor element. The method comprises connecting the first terminal of the sensor element to a second reference voltage, measuring a second voltage difference over the sensor element and measuring a second current flowing through the sensor element. The method comprises calculating an error value indicative of the measurement error and/or a sensor readout value that is corrected for the measurement error by taking the first voltage difference, the second voltage difference, the first current and the second current into account.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
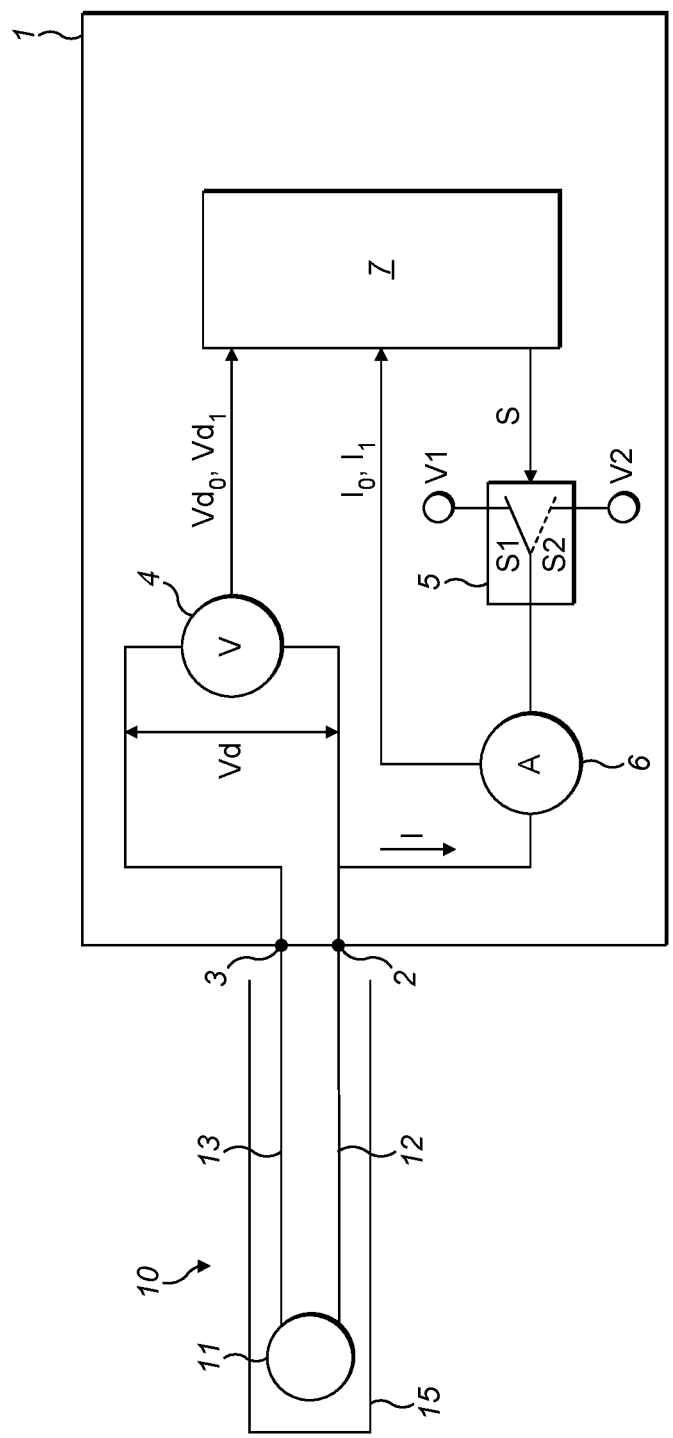
FIG. 1 illustrates a circuit in accordance with embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, the present invention relates to a circuit for determining and/or compensating for a measurement error of a sheathed sensor due to a property of a sheath of the sheathed sensor. The circuit comprises a first terminal and a second terminal for connecting to a pair of sensor signal leads of a sensor element in a sheathed sensor. The circuit also comprises a voltage measurement circuit for measuring a voltage difference between the first terminal and the second terminal and generating a measurement signal indicative of the measured voltage difference. The circuit comprises a switching unit for controllably switching an electrical connection between a first state in which the first terminal is electrically connected to a first reference voltage and a second state in which the first terminal is electrically connected to a second reference voltage, e.g. the first reference voltage and the second reference voltage being different voltages. The circuit comprises a correction measurement circuit for measuring a current running from the first terminal through the switching unit and for generating a correction signal indicative of said current. The circuit comprises a controller, e.g. a processing unit, for receiving both the measurement signal and the correction signal in respectively the first state and the second state by controlling the switching of the switching unit. The controller is also adapted for calculating a sensor readout value of the sheathed sensor that is corrected for the measurement error, and/or an error value indicative of the measurement error by taking the measurement signal and the correction signal into account as generated in both the first state and the second state.

It is known to the skilled person that electric property values, such as of the first reference voltage, the second reference voltage, the resistor R11 as referred to further hereinbelow, and/or the current Isens as referred to further hereinbelow, can be measured during calibration or when the circuit is in use, e.g. to be taken into account by the controller.

Referring to FIG. 1, a circuit 1 for determining, and/or compensating for, a measurement error of a sheathed sensor 10 in accordance with embodiments of the present invention is shown.

Figure 2:
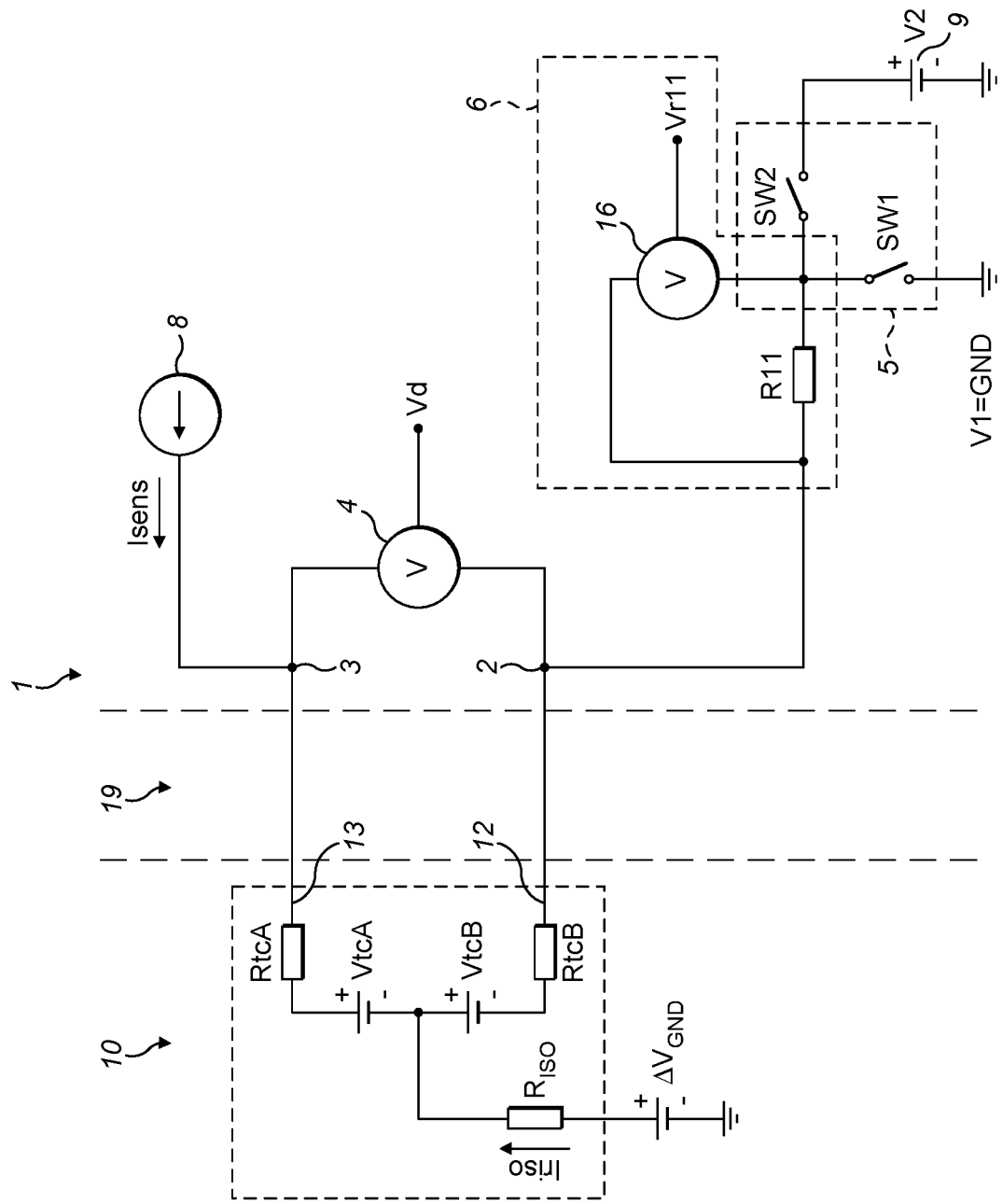
FIG. 2 shows a schematic diagram of a circuit in accordance with embodiments of the present invention.

The circuit comprises a first terminal 2 and a second terminal 3 for connecting to a pair of sensor signal leads 12, 13 of a sensor element 11 in the sheathed sensor 10. For example, the sheathed sensor 10 may comprise the sensor element 11 having complementary terminals connected to respectively a first lead 12 and a second lead 13 of the pair sensor leads. The sensor element 11 may be positioned within a sheath 15 for electrically insulating the sensor element 11, e.g. for electrically insulating the sensor element 11 and the pair of sensor signal leads 12, 13, for example to reduce or prevent external electromagnetic disturbances of the sensor element 11 and the pair of sensor leads 12, 13. The pair of sensor signal leads 12, 13 may extend from the sheath to connect to the first and second terminal 2, 3. The pair of signal leads 12, 13 may be directly connectable to the terminals 2, 3, or the pair of signal leads may be connected to an intermediate carrier 19, e.g. a printed circuit board (PCB) 19, as illustrated in FIG. 2, which electrically connects each of the pair of signal leads 12, 13 to a corresponding terminal 2, 3 of the circuit 1.

The circuit 1 comprises a voltage measurement circuit 4 for measuring a voltage difference between the first terminal 2 and the second terminal 3 and for generating a measurement signal Vd indicative of the measured voltage difference.

The circuit comprises a switching unit 5 for controllably switching an electrical connection between a first state S1 in which the first terminal 2 is electrically connected to a first reference voltage V1 and a second state S2 in which the first terminal 2 is electrically connected to a second reference voltage V2, e.g. the first reference voltage V1 and the second reference voltage V2 being different voltages.

For example, the circuit may be adapted for generating or receiving the first reference voltage V1 and the second reference voltage V2 as predetermined and/or known reference voltages, in operation of the device. The reference voltages V1, V2 may be generates as sufficiently stable, e.g. substantially stable, voltages. For example, during calibration of the circuit 1, the value of the first reference voltage V1 and/or the second reference voltage V2 may be measured and stored, e.g. as a constant, in a data storage memory, e.g. a non-volatile memory, accessible for use by the controller, e.g. to take into account when calculating the sensor readout value or error value. For example, during calibration of the circuit 1, the value of the first reference voltage V1 relative to the electric ground, the second reference voltage V2 relative to the electric ground and/or the second reference voltage V2 relative to the first reference voltage V1 may be measured and stored.

The circuit comprises a correction measurement circuit 6 for measuring a current I running from the first terminal 2 through the switching unit 5 and for generating a correction signal indicative of said current.

The circuit comprises a controller 7, e.g. a processing unit, for receiving the measurement signal $Vd_0$ and the correction signal $I_0$ in the first state S1 and for receiving the measurement signal $Vd_1$ and the correction signal $I_1$ in the second state S2 by controlling the switching of the switching unit 5. For example, the controller 7 may generate at least one control signal S for controlling the switching unit 5 to switch between the first and second state S1, S2.

The controller 7 is also adapted for calculating a sensor readout value that is corrected for the measurement error and/or an error value indicative of a measurement error of the measurement signal by taking the measurement signal $Vd_0$, $Vd_1$ as generated in both the first state S1 and the second state S2 and the correction signal $I_0$, $I_1$ as generated in both the first state S1 and the second state S2 into account.

The controller 7 may furthermore be adapted for storing and/or outputting the sensor readout value that is corrected for the measurement error and/or the error value.

FIG. 2 shows a schematic electrical diagram of a circuit in accordance with embodiments of the present invention. The circuit may be adapted for determining and/or compensating for the measurement error of the sheathed sensor 10 due to an insulation resistance $R_{iso}$ of the sheath, e.g. due to a leakage current Iriso, and/or an electric potential difference between the sheath and the electric ground $\Delta V_{GND}$.

In embodiments of the present invention, the sensor element 11 in the sheathed sensor 10 may comprise a thermometer element. Likewise, the circuit 1 may be thermometer readout circuit or thermometer readout correction circuit.

The thermometer element may comprise a thermocouple. For example, the electric properties of a sensor element 11 comprising a thermocouple may be represented by thermocouple resistances RtcA, RtcB, i.e. the total thermocouple resistance Rtc=RtcA+RtcB may represent the thermowire material resistance. Furthermore, an electromotive force (emf) of the thermocouple, i.e. a voltage caused by the Seebeck effect due to a temperature gradient, may be represented by Vtc=VtcA+VtcB.

The thermometer element may comprise a resistive temperature detector (RTD). For example, the electric properties of a sensor element 11 comprising an RTD may be represented by the total RTD resistance Rtc=RtcA+RtcB. In such thermometer element, the emf voltages VtcA and VtcB may be substantially zero, VtcA=VtcB=0, and therefore ignored in the schematic diagram of FIG. 2.

The circuit 1 comprises at least one first terminal 2 and at least one second terminal 3 for respectively connecting to a pair of sensor signal leads 12, 13 of a sensor element 11 in the sheathed sensor 10.

The circuit 1 comprises a voltage measurement circuit 4 for measuring a voltage difference between the first terminal 2 and the second terminal 3 and for generating a measurement signal Vd indicative of the measured voltage difference. For example, the voltage measurement circuit 4 may comprise a circuit as known in the art for generating a signal, e.g. a digital signal, indicative of the voltage difference. Thus, the voltage measurement circuit 4 may comprise a component and/or a circuit as known in the art for reading out a sensor, e.g. a temperature sensor, such as a thermocouple and/or RTD, by voltage measurement.

The circuit 1 may also comprise a current source 8 for injecting an electric current via the first terminal 2 or the second terminal 3 into the sensor element 11, e.g. for reading out an RTD. For example, an RTD may be read out by applying a known current Isens via the current source 8, measuring a voltage difference over the RTD sensor and determining the a priori unknown resistance of the RTD based on this current and this voltage difference, e.g. further taking into account a correction as provided by embodiments in accordance with the present invention. For example, the current source 8 may be adapted for injecting a predetermined and/or known further current Isens via the second terminal 3, e.g. such that a current runs through the sensor element 11, e.g. an RTD, back to the first terminal 2, in operation of the device. Alternatively, the further current may be injected via the first terminal 2 such that a current runs over the sensor element and back to the second terminal 3. The current source 8 may generate a sufficiently stable, e.g. substantially stable, current as the predetermined further current Isens. For example, during calibration of the circuit 1, the value of the further current Isens may be measured and stored, e.g. as a constant, in a data storage memory, e.g. a non-volatile memory, accessible for use by the controller, e.g. to take into account when calculating the sensor readout value or error value.

The switching unit 5 may comprise, for example, a first switch SW1, for controllably electrically connecting and disconnecting the first terminal 2 to a first reference voltage V1. For example, the first reference voltage V1 may be an electric ground potential as shown in FIG. 2, but embodiments of the present invention are not limited thereto, e.g. the circuit 1 may comprise an internal voltage source for generating the first reference voltage V1, e.g. substantially as described hereinbelow for generating the second reference voltage V2.

The switching unit 5 may comprise, for example, a second switch SW2, for controllably electrically connecting and disconnecting the first terminal 2 to a second reference voltage V2. For example, the circuit 1 may comprise an internal voltage source 9 for generating the second reference voltage V2, e.g. a substantially predetermined voltage V2 that is substantially different from the first reference voltage V1, e.g. from ground.

The correction measurement circuit 6 may comprise a resistor R11 having a predetermined resistance and a further voltage measurement circuit 16 for measuring a voltage Vr11 over the resistor R11.

For example, the resistor R11 may be connected in series between the first terminal 2 and the switching unit 5. Thus, the correction measurement circuit 6 may be adapted for measuring a current running from the first terminal 2 through the switching unit 5 and for generating a correction signal as indicative of that current in the form of a voltage over the resistor R11 through which that current flows. For example, during calibration of the circuit, the resistance of the internal resistance R11 may be measured and stored, e.g. as a constant, in a data storage memory, e.g. a non-volatile memory, of the controller to be taken in to account.

The controller 7 may comprise a processing unit, e.g. a processor, and/or a data storage memory. The controller may be adapted for receiving the measurement signal $Vd_0$ and the correction signal $I_0$, e.g. $Vr11_0$, in the first state S1 and for receiving the measurement signal $Vd_1$ and the correction signal $I_1$, e.g. $Vr11_1$, in the second state S2. This can be achieved by controlling the switching of the switching unit 5, e.g. of the switches SW1 and SW2 between a first state S1 in which SW1 is ON, i.e. connects the first terminal to the first reference voltage V1, and SW2 is OFF, i.e. disconnects the first terminal from the second reference voltage V2, and a second state S2 in which SW1 is OFF and SW2 is ON.

The controller 7 is also adapted for calculating a readout value that is corrected for the measurement error and/or an error value indicative of the measurement error.

This calculating may comprise calculating a first difference of the measurement signal obtained in the first state S1 of the switching unit 5 and the measurement signal obtained in the second state S2 of the switching unit and a second difference of the correction signal obtained in the first state S1 of the switching unit 5 and the correction signal obtained in the second state S2 of the switching unit.

Calculating the error value and/or the sensor readout value may comprise multiplying the correction signal obtained in the first state S1 of the switching unit 5 by a ratio of the first difference and the second difference.

For example, for a thermocouple sensor element, the sensor readout value may correspond to a difference of the measurement signal $Vd_0$, e.g. where the first reference voltage is the ground voltage, and the error value Vtc_err.

In the state S1, the following equations may apply:

$Vtc\_err = Iriso_0 \cdot RtcB$ $Vd_0 = Vtc + Vtc\_err = Vtc + Iriso_0 \cdot RtcB$ $Vr11_0 = Iriso_0 \cdot R11$ where $Iriso_0$ refers to the leakage current Iriso in state S1, $Vd_0$ refers to the measurement signal Vd in state S1 and $Vr11_0$ refers to the correction signal in state S1.

Likewise, in the state S2, the following equations apply:

$Vd_1 = Vtc + Iriso_1 \cdot RtcB$ $Vr11_1 = Iriso_1 \cdot R11$ where $Iriso_1$ refers to the leakage current Iriso in state S2, $Vd_1$ refers to the measurement signal Vd in state S2 and $Vr11_1$ refers to the correction signal in state S2.

Thus, the error value Vtc_err may be calculated by:

$$Vtc\_err = Vr11_0 \cdot \left( \frac{Vd_1 - Vd_0}{Vr11_1 - Vr11_0} \right)$$

and the sensor readout value Vtc may be calculated by:

$$Vtc = Vd_0 - Vr11_0 \cdot \left( \frac{Vd_1 - Vd_0}{Vr11_1 - Vr11_0} \right)$$

In another example, for a RTD sensor element, the sensor readout value may correspond to the resistance Rrtd=RtcA+RtcB of the RTD sensor element, e.g. compensated for the leakage current Iriso.

In the state S1, the following equations may apply:

$Vrtd\_err = Iriso_0 \cdot RtcB$ $Vrtd = Isens \cdot (RtcA + RtcB)$ $Vd_0 = Vrtd + Vrtd\_err$ $Vr11_0 = (Iriso_0 + Isens) \cdot R11$ where $Iriso_0$ refers to the leakage current Iriso in state S1, $Vd_0$ refers to the measurement signal Vd in state S1 and $Vr11_0$ refers to the correction signal in state S1.

Likewise, in the state S2, the following equations apply:

$Vd_1 = Iriso_1 \cdot RtcB$ $Vr11_1 = Iriso_1 \cdot R11$ where $Iriso_1$ refers to the leakage current Iriso in state S2, $Vd_1$ refers to the measurement signal Vd in state S2 and $Vr11_1$ refers to the correction signal in state S2.

Thus, the error value Rrtd_err may be calculated by:

$$Rrtd\_err = \frac{Vrtd\_err}{Isens} = \frac{Vd_1 \cdot Vr11_0 - Isens \cdot R11 \cdot Vd_1}{Isens \cdot Vr11_1}$$

and the sensor readout value Rrtd may be calculated by:

$$Rrtd = \frac{Vd_0}{Isens} - Rrtd\_err$$

or equivalently, $$Rrtd = RtcA + RtcB = \frac{Vd_0 \cdot Vr11_1 - Vd_1 \cdot Vr11_0 + Isens \cdot R11 \cdot Vd_1}{Isens \cdot Vr11_1}$$

Therefore, the controller 7 may be adapted for calculating the error value and/or the sensor readout value, in which this calculation comprises calculating a subtraction of a minuend (or subtrahend) comprising $$\frac{Vd_1 \cdot I_0}{Isens \cdot I_1}$$

and a subtrahend (or respectively minuend) comprising $$\frac{Vd_1}{I_1}.$$

Furthermore, the controller may be adapted for calculating an isolation resistance of a sheathed sensor, e.g. a loop resistance Rloop between the electric ground of the circuit and a remote ground of the sheathed sensor, e.g. at a voltage $\Delta V_{GND}$ with respect to the electric ground of the circuit, over the sensor element.

This loop resistance Rloop can be expressed as:

$Rloop=R_{ISO}+RtcB+R11$

In the state S1, following equations can be formulated:

$Iriso_0 \cdot Rloop=\Delta V_{GND}-V1$ $Vr11_0=Iriso_0 \cdot R11$ where $Iriso_0$ refers to the leakage current Iriso in state S1 and $Vr11_0$ refers to the correction signal in state S1.

In the state S2, following equations can be formulated:

$Iriso_1 \cdot Rloop=\Delta V_{GND}-V2$ $Vr11_1=Iriso_1 \cdot R11$ where $Iriso_1$ refers to the leakage current Iriso in state S2 and $Vr11_1$ refers to the correction signal in state S2.

Thus, the loop resistance can be determined as:

$$Rloop = \frac{V2-V1}{Vr11_0 - Vr11_1} \cdot R11$$

Thus, the controller 7 may be adapted for calculating the loop resistance Rloop between the electric ground of the circuit and a remote ground of the sheathed sensor by dividing the further signal indicative of the voltage V2 over the internal voltage source 9 by a difference of the correction signal $I_0$ obtained in the first state S1 of the switching unit 5 and the correction signal $I_1$ obtained in the second state S2 of the switching unit.

In a second aspect, the present invention also relates to a sensor system comprising a circuit 1 in accordance with embodiments of the first aspect of the present invention and a sheathed sensor 10 comprising a sensor element 11 having complementary terminals connected to respectively a first lead 12 and a second lead 13 of a pair of sensor signal leads, in which the sensor element 11 is positioned within a sheath 15 for electrically insulating the sensor element 11 and the pair of sensor signal leads 12, 13 to reduce and/or prevent external electromagnetic disturbances of the sheathed sensor. The pair of sensor signal leads 12, 13 extend from the sheath 15 to connect, e.g. to be connected, to the first and second terminal 2, 3 of the circuit 1. The sensor element may comprise a thermometer, e.g. a temperature sensor, such as a thermocouple and/or a resistive temperature detector.

In a third aspect, the present invention relates to a method for determining and/or compensating for a measurement error of a sheathed sensor due to a property of a sheath of the sheathed sensor.

Figure 3:
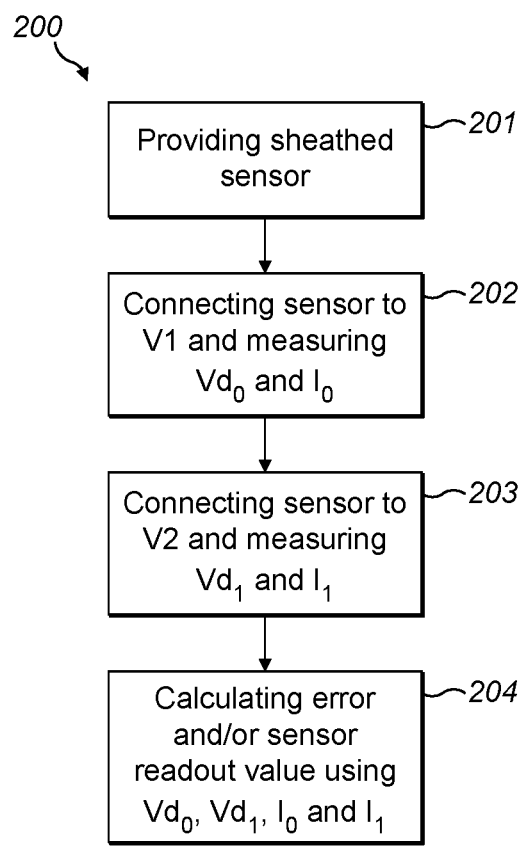
FIG. 3 shows an exemplary method in accordance with embodiments of the present invention.

Referring to FIG. 3, an exemplary method 200 in accordance with embodiments of the present invention is shown. The method 200 comprises providing 201 a sheathed sensor 10 comprising a sensor element 11 positioned within a sheath 15 for electrically insulating the sensor element 11 to reduce and/or prevent external electromagnetic disturbances of the sheathed sensor. The method 200 may comprise operating a circuit in accordance with embodiments of the first aspect of the present invention.

The method comprises connecting 202 a first terminal of the sensor element to a first reference voltage V1, e.g. ground, measuring a first voltage difference $Vd_0$ over the sensor element 11 and measuring a first current $I_0$ flowing through the sensor element 11.

The method comprises connecting 203 the first terminal of the sensor element to a second reference voltage V2, measuring a second voltage difference $Vd_1$ over the sensor element 11 and measuring a second current $I_1$ flowing through the sensor element 11.

The method may comprise switching an electrical connection between the first terminal and respectively the first reference voltage and the second reference voltage, e.g. using a switching unit.

The method may comprise injecting a further electric current Isens into the sensor element 11, e.g. while the steps of connecting and measuring 202,203 are performed.

The method comprises calculating 204 an error value indicative of the measurement error and/or a sensor readout value that is corrected for the measurement error by taking the first voltage difference $Vd_0$, the second voltage difference $Vd_1$, the first current $I_0$ and the second current $I_1$ into account.

Calculating 204 the error value may comprise calculating a loop resistance Rloop between an electric ground of the circuit and a remote ground of the sheathed sensor by dividing a difference of the second reference voltage V2 and the first reference voltage V1 by a difference of the currents $I_0$ and $I_1$.

Calculating 204 the error value and/or sensor readout value may comprise calculating a first difference of the voltages $Vd_0$ and $Vd_1$ and a second difference of the currents $I_0$ and $I_1$. Calculating 204 the error value and/or sensor readout value may comprise multiplying the current $I_0$ by a ratio of the first difference over the second difference.

Calculating 204 the error value and/or sensor readout value may comprise calculating a subtraction of a minuend comprising $$\frac{Vd_1 \cdot I_0}{Isens \cdot I_1}$$

and a subtrahend comprising $$\frac{Vd_1}{I_1}.$$

The method may comprise measuring voltages $Vr11_0$ and $Vr11_1$ over a reference resistor R11 having a predetermined resistance to measure the currents $I_0$ and $I_1$.

The invention claimed is:

1. A circuit for determining and/or compensating for a measurement error of a sheathed sensor due to a property of a sheath of said sheathed sensor, the circuit comprising:
    a first terminal and a second terminal for connecting to a pair of sensor signal leads of a sensor element in a sheathed sensor;
    a voltage measurement circuit for measuring a voltage difference between said first terminal and said second terminal and generating a measurement signal indicative of said measured voltage difference;
a switching unit for controllably switching an electrical connection between a first state and a second state in which the first terminal is electrically connected to respectively a first reference voltage and a second reference voltage;
a correction measurement circuit for measuring a current running from the first terminal through the switching unit and for generating a correction signal indicative of said current; and
a controller for receiving said measurement signal and said correction signal in said first state and said second state by controlling said switching of said switching unit, the controller being adapted for calculating
an error value indicative of said measurement error by taking said measurement signal and said correction signal into account as generated in both said first state and said second state, and/or
a sensor readout value that is corrected for said measurement error by taking said measurement signal and said correction signal into account as generated in both said first state and said second state.

2. The circuit of claim 1, wherein said switching unit comprises an internal voltage source for generating said second reference voltage, and wherein said first reference voltage is an electric ground potential.

3. The circuit of claim 2, wherein said controller is adapted for calculating a loop resistance between an electric ground of the circuit and a remote ground of said sheathed sensor by dividing a difference of the second reference voltage and the first reference voltage by a difference of said correction signal obtained in the first state of the switching unit and the correction signal obtained in the second state of the switching unit.

4. The circuit of claim 1, wherein said controller is adapted for calculating said error value indicative of said measurement error and/or said sensor readout value corrected for said measurement error,
wherein said measurement error represents a deviation between said voltage difference and an electromotive force, and/or
wherein said sensor readout value is indicative of said electromotive force,
wherein said electromotive force is an electromotive force generated over a thermocouple when said circuit is connected to said sheathed sensor in which said sensor element comprises said thermocouple.

5. The circuit of claim 4, wherein said controller is adapted for calculating a first difference of the measurement signal obtained in the first state of the switching unit and the measurement signal obtained in the second state of the switching unit and a second difference of the correction signal obtained in the first state of the switching unit and the correction signal obtained in the second state of the switching unit, and wherein calculating said error value and/or said sensor readout value comprises multiplying the correction signal obtained in the first state of the switching unit by a ratio of said first difference and said second difference.

6. The circuit of claim 1, in which said controller is adapted for calculating said error value indicative of said measurement error and/or said sensor readout value corrected for said measurement error,
wherein said sensor readout value is indicative of a resistance of a resistive temperature detector and/or said error value represents an error of said resistance due to a leakage current and/or a parasitic resistance, when said circuit is connected to said sheathed sensor in which said sensor element comprises said resistive temperature detector.

7. The circuit of claim 6, wherein said measurement error represents an insulation resistance of a sheath of the sheathed sensor, a loop resistance between an electric ground of the circuit and a remote ground of the sheath and/or a leakage current through the sheath.

8. The circuit of claim 6, comprising a current source for injecting a further electric current via the first terminal or the second terminal into the sensor element when said circuit is connected to said sheathed sensor.

9. The circuit of claim 8, wherein said controller is adapted for calculating said error value and/or said sensor readout value, in which said calculation comprises calculating a subtraction of a minuend comprising $$\frac{Vd_1 \cdot I_0}{Isens \cdot I_1}$$

and a subtrahend comprising $$\frac{Vd_1}{I_1},$$

in which $Vd_0$ and $Vd_1$ represent the measurement signal in respectively the first state and the second state, $I_0$ and $I_1$ represent the correction signal in respectively the first state and the second state and Isens represent the further electric current.

10. The circuit of claim 1, wherein said correction measurement circuit comprises a reference resistor having a predetermined resistance and a further voltage measurement circuit for measuring a voltage over the resistor, such that said correction measurement circuit is adapted for generating the correction signal as indicative of said current in the form of said voltage over said reference resistor.

11. The circuit of claim 1, wherein said switching unit comprises a first switch for controllably electrically connecting and disconnecting the first terminal to said first reference voltage and a second switch for controllably electrically connecting and disconnecting the first terminal to said second reference voltage.

12. The circuit of claim 1, wherein the controller is adapted for calculating
the error value indicative of said measurement error by taking said measurement signal and said correction signal into account as generated in both said first state and said second state.

13. The circuit of claim 1, wherein the controller is adapted for calculating
the sensor readout value that is corrected for said measurement error by taking said measurement signal and said correction signal into account as generated in both said first state and said second state.

14. The circuit of claim 1, wherein the controller is adapted for calculating
the error value indicative of said measurement error by taking said measurement signal and said correction signal into account as generated in both said first state and said second state, and
the sensor readout value that is corrected for said measurement error by taking said measurement signal and said correction signal into account as generated in both said first state and said second state.

15. A sensor system comprising a circuit for determining and/or compensating for a measurement error of a sheathed sensor due to a property of a sheath of said sheathed sensor and said sheathed sensor, said circuit comprising:

a first terminal and a second terminal for connecting to a pair of sensor signal leads of a sensor element in a sheathed sensor;

a voltage measurement circuit for measuring a voltage difference between said first terminal and said second terminal and generating a measurement signal indicative of said measured voltage difference;

a switching unit for controllably switching an electrical connection between a first state and a second state in which the first terminal is electrically connected to respectively a first reference voltage and a second reference voltage;

a correction measurement circuit for measuring a current running from the first terminal through the switching unit and for generating a correction signal indicative of said current; and a controller for receiving said measurement signal and said correction signal in said first state and said second state by controlling said switching of said switching unit, the controller being adapted for calculating an error value indicative of said measurement error by taking said measurement signal and said correction signal into account as generated in both said first state and said second state, and/or a sensor readout value that is corrected for said measurement error by taking said measurement signal and said correction signal into account as generated in both said first state and said second state, and said sensor element comprising complementary terminals connected to respectively a first lead and a second lead of a pair of sensor signal leads, wherein said sensor element is positioned within a sheath for electrically insulating the sensor element and the pair of sensor signal leads to reduce and/or prevent external electromagnetic disturbances of the sheathed sensor, wherein said pair of sensor signal leads extend from the sheath to connect to said first and second terminal of said circuit.

16. The sensor system of claim 15, wherein said sensor element comprises a thermocouple.

17. The sensor system of claim 15, wherein said sensor element comprises a resistive temperature detector.

18. The sensor system of claim 15, wherein said sensor element is positioned within a sheath for electrically insulating the sensor element and the pair of sensor signal leads that prevents external electromagnetic disturbances of the sheathed sensor.

19. A method for determining and/or compensating for a measurement error of a sheathed sensor due to a property of a sheath of the sheathed sensor, the method comprising:

providing a sheathed sensor comprising a sensor element positioned within a sheath for electrically insulating the sensor element to reduce and/or prevent external electromagnetic disturbances of the sheathed sensor;

connecting a first terminal of the sensor element to a first reference voltage, measuring a first voltage difference over the sensor element and measuring a first current flowing through the sensor element;

connecting the first terminal of the sensor element to a second reference voltage, measuring a second voltage difference over the sensor element and measuring a second current flowing through the sensor element; and calculating an error value indicative of the measurement error by taking said measurement signal and said correction signal into account as generated in both said first state and said second state, and/or a sensor readout value that is corrected for the measurement error by taking the first voltage difference, the second voltage difference, the first current and the second current into account.

* * * * *